United States Patent [19]
Han

[11] Patent Number: 5,660,955
[45] Date of Patent: Aug. 26, 1997

[54] PHASE SHIFT MASK AND MANUFACTURING METHOD THEREOF

[75] Inventor: Oh-Seok Han, Seoul, Rep. of Korea

[73] Assignee: LG Semkon Co., Ltd., Cheongju, Rep. of Korea

[21] Appl. No.: 558,304

[22] Filed: Nov. 15, 1995

[51] Int. Cl.⁶ .................................................. G03F 9/00
[52] U.S. Cl. .............................. 430/5; 430/311; 430/314
[58] Field of Search ........................ 430/5, 311, 312, 430/314, 322

[56] References Cited

U.S. PATENT DOCUMENTS

| | | | |
|---|---|---|---|
| 5,429,896 | 7/1995 | Hasegawa et al. | 430/5 |
| 5,541,025 | 7/1996 | Oi et al. | 430/5 |

*Primary Examiner*—S. Rosasco
*Attorney, Agent, or Firm*—Alan R. Loudermilk

[57] ABSTRACT

A phase shift mask is disclosed, which includes a substrate, a plurality of first light shading film pairs formed at an interval on the substrate, a plurality of phase shift layers formed on the first light shading film pairs, and a plurality of second light shading pairs formed on portions of the substrate exposed between the first light shading film pairs. A manufacturing method of a phase shift mask also is disclosed, which includes the steps of providing a substrate, forming a plurality of first light shading film pairs at an interval on the rear side of the substrate, forming a plurality of phase shift layers on the plurality of first light shading film pairs, and forming a plurality of second light shading film pairs between the plurality of first light shading film pairs. The mask and its manufacturing methods may improve the process by addressing the difference in transmitted optical intensities resulting from the refractive indices and optical transmissivities of the various layers.

12 Claims, 10 Drawing Sheets

5,660,955

PHASE SHIFT MASK AND MANUFACTURING METHOD THEREOF

FIELD OF THE INVENTION

The present invention relates to phase shift masks and manufacturing methods of phase shift masks, and more particularly to phase shift masks and manufacturing methods thereof with an improved difference of transmitted optical intensities due to refractive index and optical transmissivity differences.

BACKGROUND OF THE INVENTION

Referring to FIGS. 1A–1D, light shading film 12 such as chrome is provided in a desired pattern on mask substrate 11 of quartz glass, and phase shift layer 14 for increasing the intensity of projected light is selectively applied using a transparent material of which refractive index n is larger than 1.

As illustrated in FIG. 1A, light passes through either phase shift layer 14 of which mask refractive index meets the condition of n>1 (1), or through an area of which the refractive index meets the condition of n=1 (2). The transmitted light energy according to the intrinsic light absorption coefficients of each area through which light passes is illustrated in FIG. 1B. Here, the thickness of the phase shift layer is adjusted to make the phase shift between the two areas 180°.

FIG. 1C illustrates the intensity of light according to the transmitted light energy, in which the intensity of light passed through phase shift layer 14 is weaker as much as $\Delta i$ due to the differences in light transmissivities.

FIG. 1D illustrates a state of photoresist 13 after development, in which the profiles appear to be different due to the differences in intensities of areas (1) and (2).

Hereinafter, a conventional phase shift mask manufacturing method will be described with reference to FIGS. 2A to 2J.

Light shading film 12 is formed on quartz glass substrate 11 (FIG. 2A). Photoresist 13 is applied to quartz glass substrate 11 (FIG. 2B). Photoresist 13 is exposed to light by an E-beam using direct lighting equipment, and a plurality of patterns of photoresist 13 of a uniform interval are developed and dried as illustrated (FIG. 2C). Light shading film 112 is etched using patterned photoresist 13 as a mask (FIG. 2D). The remainder of photoresist 13 on light shading film 12 is removed (FIG. 2E). Phase shift layer 14 is applied on quartz glass substrate 11 and the patterns of light shading film 12 (FIG. 2F). E-beam photoresist 13' is applied on phase shift layer 14 (FIG. 2G). Photoresist 13' is developed and dried to remain on pairs of light shading films 12 (FIG. 2H). Phase shift layer 14 is etched using the patterns of photoresist 13' as a mask (FIG. 2I), and the patterns of photoresist 13' are removed (FIG. 2J).

With a phase shift mask manufactured using such a conventional method, inequalities in a transmitted image may occur due to the difference of the light transmissivity coefficients between an air area of which refractive index is 1 and phase shift layer 14 of which refractive index is larger than 1. Since the result of such a conventional method appears as a form of resist profile as illustrated in FIG. 1D, a problem may result from the process, and efforts to adjust the inequality by excessively exposing in order to compensate for an insufficiently developed area can lead to a change from the desired pattern.

SUMMARY OF THE INVENTION

To solve the problems, it is an object of the present invention to provide a phase shift mask and a method of manufacturing thereof which can compensate for the difference in light intensity according to light absorption coefficients between an area of which refractive index is 1 and an area of which refractive index is greater than 1.

Accordingly, to achieve the above and other objects, there is provided a phase shift mask comprising: a substrate; a plurality of first light shading film pairs formed at an interval on the substrate; a plurality of phase shift layers formed on each of the first light shading film pairs; and a plurality of second light shading pairs formed on portions of a surface of the substrate exposed between the first light shading film pairs.

To achieve the above and other objects, there is provided a manufacturing method of a phase shift mask comprising the steps of: providing a substrate; forming a plurality of first light shading film pairs at an interval on the rear side of the substrate; forming a plurality of phase shift layers on the plurality of first light shading film pairs; and forming a plurality of second light shading film pairs between the plurality of first light shading film pairs.

BRIEF DESCRIPTION OF THE DRAWINGS

The above object and advantages of the present invention will become more apparent by describing in detail preferred embodiments thereof with reference to the attached drawings in which.

DETAILED DESCRIPTION OF THE PREFERRED EMBODIMENTS

The present invention addresses the difference in light intensities caused by differences in light transmissivity between the n=1 area and n>1 area in a phase shift mask, which can be problematic in the conventional art as discussed above.

Figure 1A:
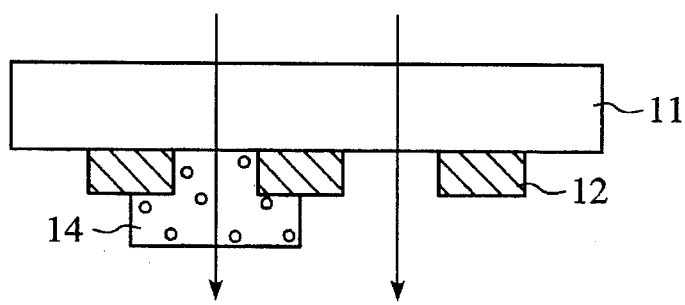
FIGS. 1A to 1D schematically illustrate a conventional phase shift mask and relevant graphs.
Figure 1B:
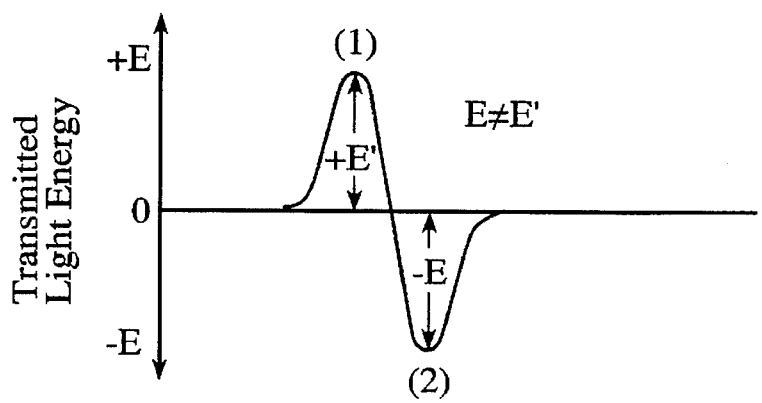
Figure 1C:
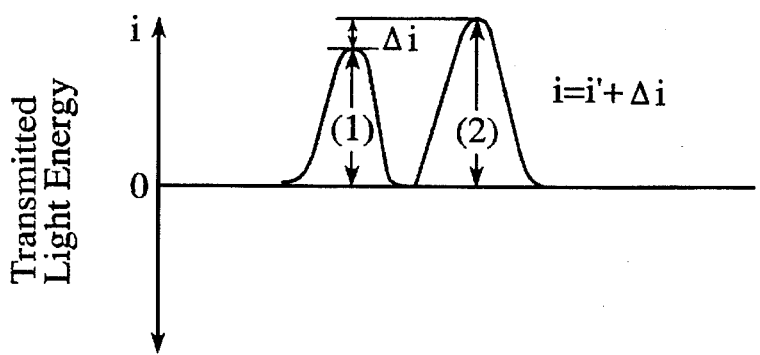
Figure 1D:
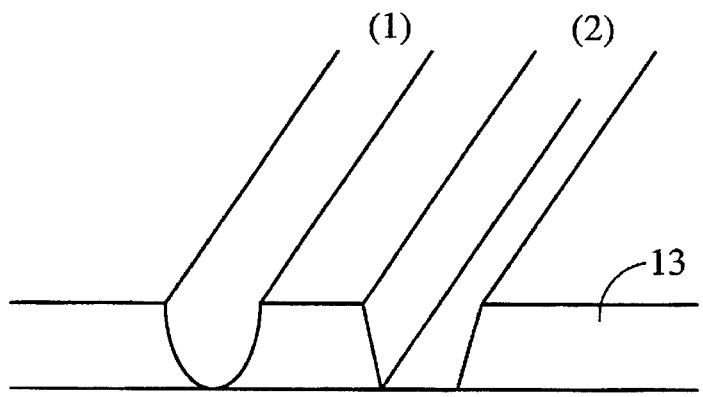
Figure 2A:
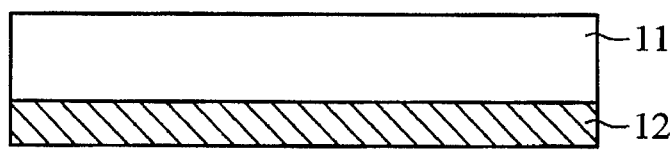
FIGS. 2A to 2J are sections illustrating a manufacturing process of a conventional phase shift mask.
Figure 2B:
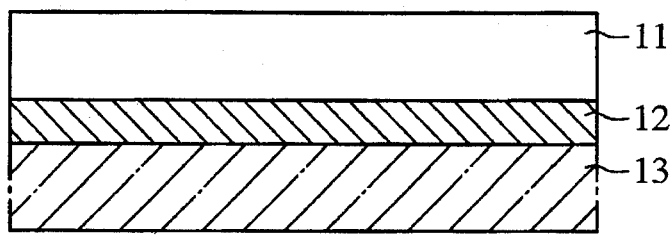
Figure 2C:
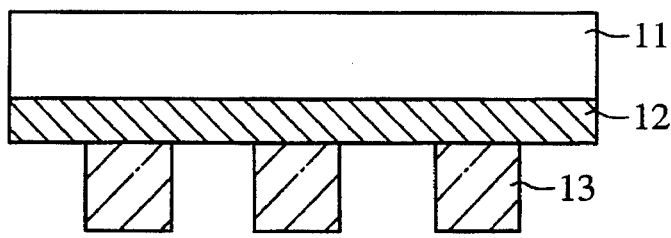
Figure 2D:
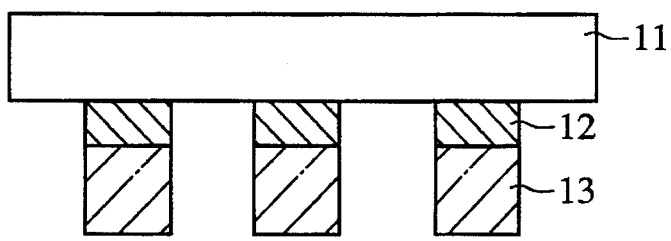
Figure 2E:
Figure 2F:
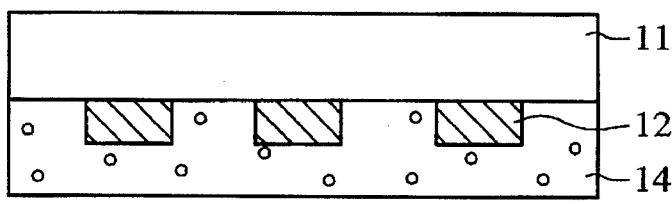
Figure 2G:
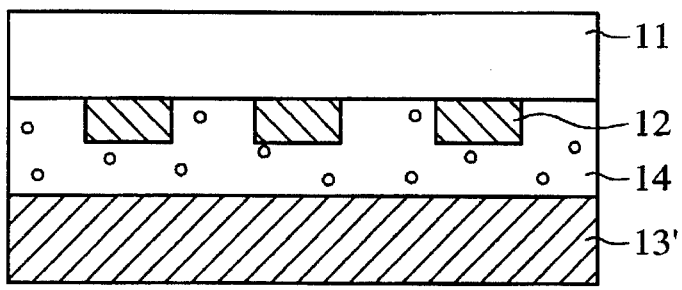
Figure 2H:
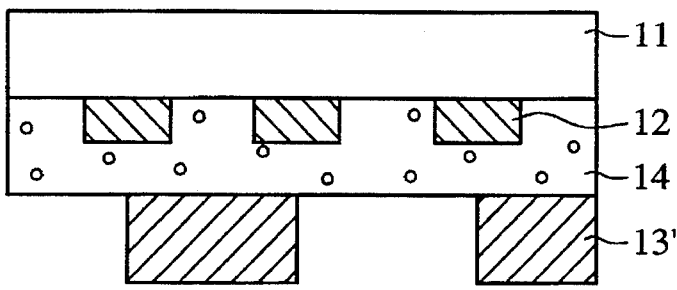
Figure 2I:
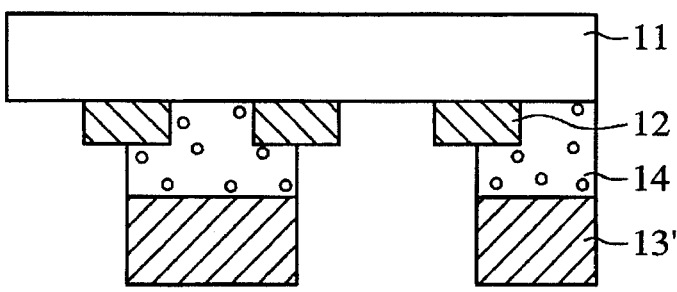
Figure 2J:
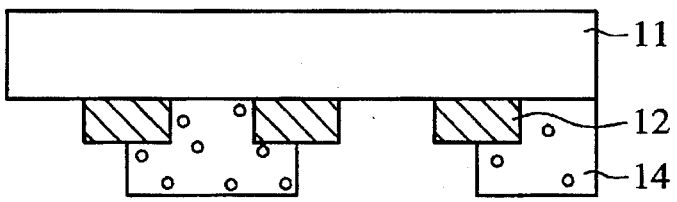
Figure 3A:
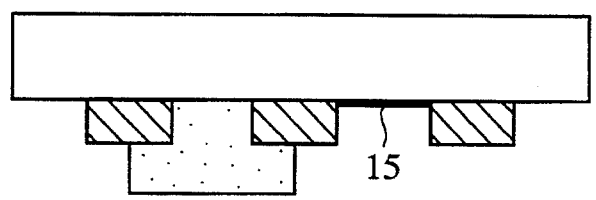
FIGS. 3A to 3D schematically illustrate a phase shift mask according to the present invention and relevant graphs.
Figure 3B:
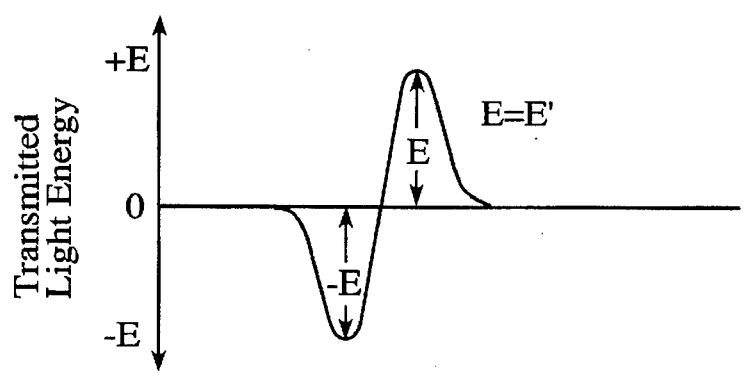
Figure 3C:
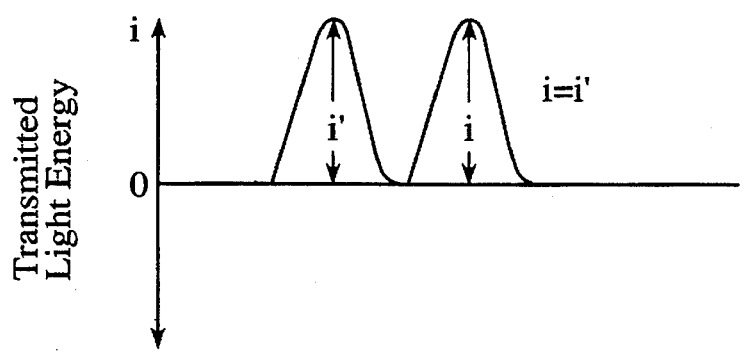
Figure 3D:
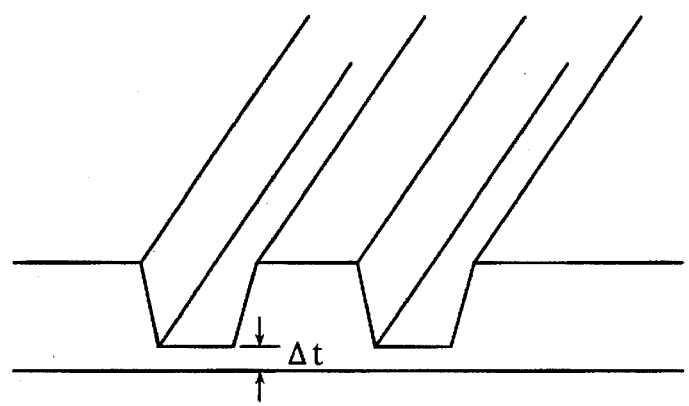

As illustrated in FIG. 3A, the present invention includes mask shading material 15 such as chrome, chrome oxide or zinc on the n=1 area to reduce the light intensity as much as the light absorption coefficient of the n>1 area. As a result, as is illustrated in FIGS. 3B–3C, the transmitted light intensities and energies may be made more equal. If the given light intensity is the same as a conventional intensity, a remaining film of $\Delta t$ or a round profile of dotted form may be achieved (see, e.g., FIG. 1D). With the present invention, however, as illustrated in FIG. 3D, profiles of the same shape may be attained, when the light intensity is adjusted with proper light quantity (volume exposure condition) in order to make the light intensity of each of the areas (n=1 and n>1) substantially the same.

In a phase shift mask according to the present invention, a light shading thin film of which n>1 is additionally attached in order to adjust light transmissivity in the n=1 area. Without being bound by theory, if the refractive index of the new thin film is n', then the thickness d of the light shading film may be $d = \lambda/2n\,(n'+1)$.

A first embodiment of the present invention will be described referring to FIGS. 4A to 4N.

Figure 4A:
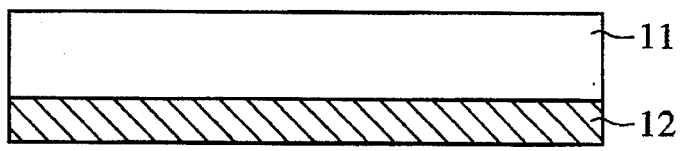
FIGS. 4A to 4N are sections illustrating a manufacturing process according to a first embodiment of the present invention.
Figure 4B:
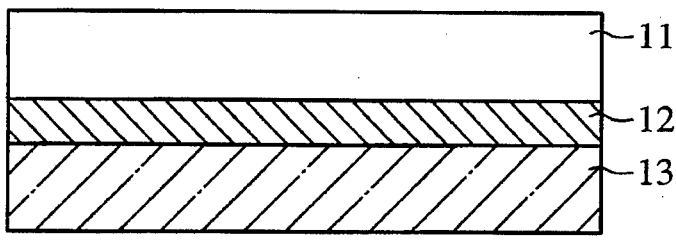
Figure 4C:
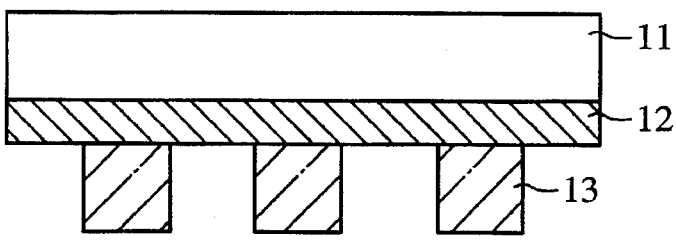
Figure 4D:
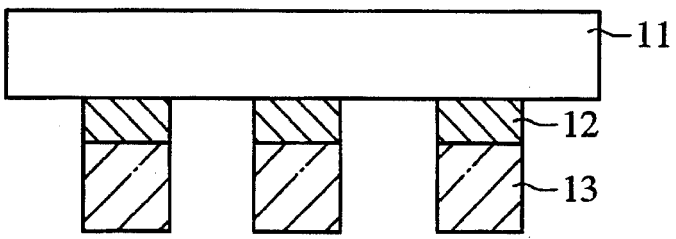
Figure 4E:
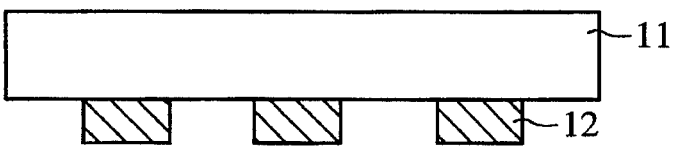
Figure 4F:
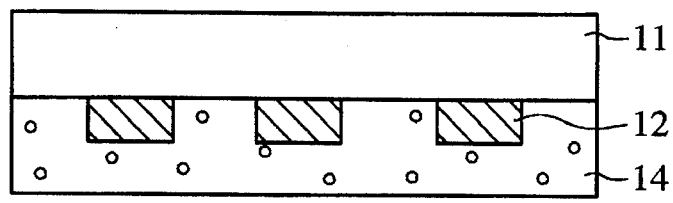
Figure 4G:
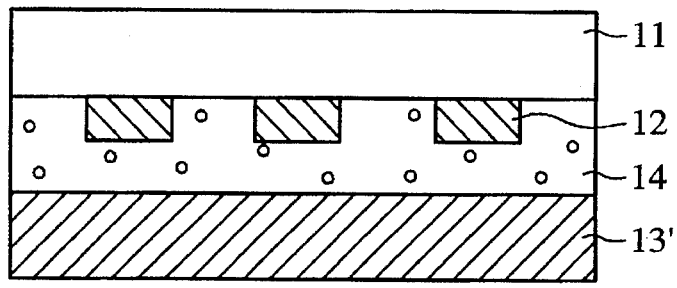
Figure 4H:
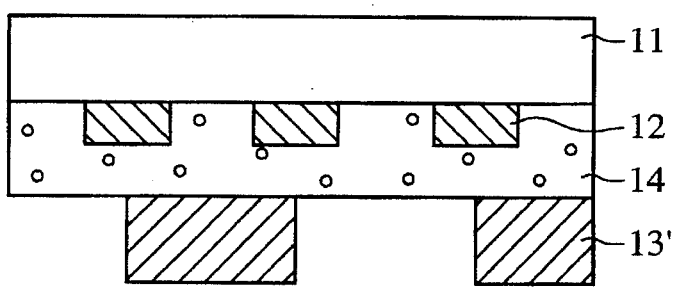
Figure 4I:
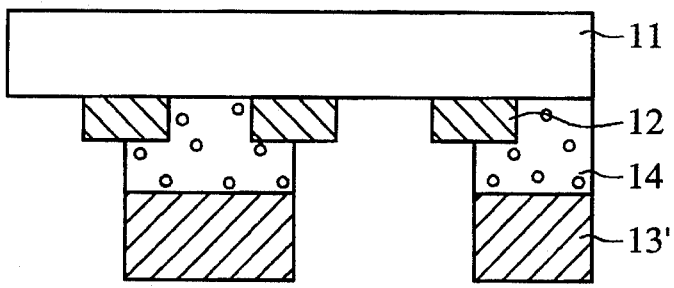
Figure 4J:
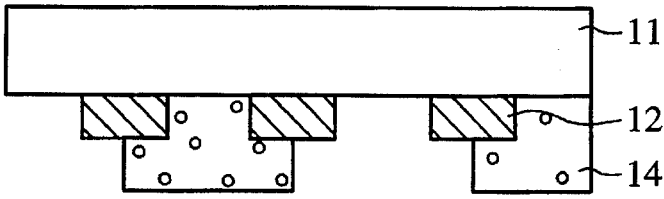
Figure 4K:
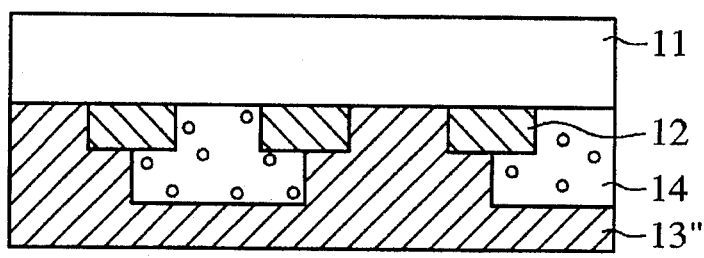
Figure 4L:
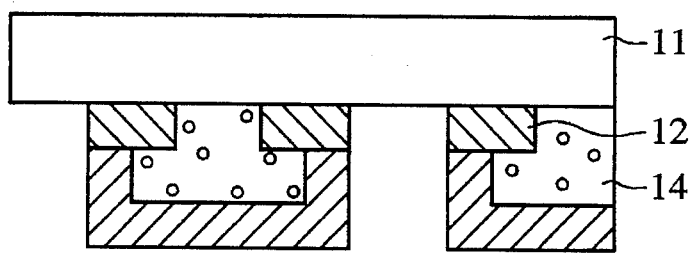
Figure 4M:
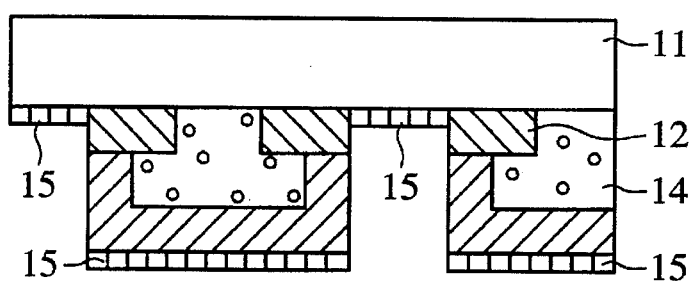
Figure 4N:
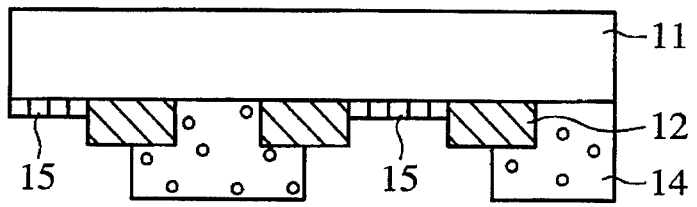

Light shading film 12 is formed on quartz glass substrate 11 (FIG. 4A). Photoresist 13 is applied to light shading film 12 and is exposed to light by direct lighting equipment, such as using an E-beam (FIG. 4B). Photoresist 13 is developed into a plurality of photoresist patterns having an interval (which may be uniform) and then dried (FIG. 4C). Light shading film 12 is etched using the patterns of photoresist 13 as a mask (FIG. 4D). The patterns of photoresist 13 on the remaining portions of light shading film 12 are removed (FIG. 4E). Phase shift layer 14 is applied on quartz glass substrate 11 and light shading film 12 (FIG. 4F). E-beam photoresist 13' is applied on phase shift layer 14 (FIG. 4G). Photoresist 13' is developed and dried on pairs of light shading films 12 as illustrated (FIG. 4H). Phase shift layer 14 is etched using photoresist 13' as a mask (FIG. 4I). A structure covering quartz glass substrate 11 is made on pairs of light shading film 12 and completed by removing photoresist 13' as illustrated (FIG. 4J). Photoresist 13" is applied on phase shift layer 14, light shading layer 12 and substrate 11 as illustrated (FIG. 4K). Photoresist 13" on pairs of light shading films 12 are developed as illustrated (FIG. 4L). Light shading material 15 is applied on the surface of quartz glass substrate 11 except an area covered by photoresist 13" (FIG. 4M). An embodiment of the present invention is completed by removing photoresist 13" (FIG. 4N).

A second embodiment of the present invention will be described referring to FIGS. 5A to 5N.

Figure 5A:
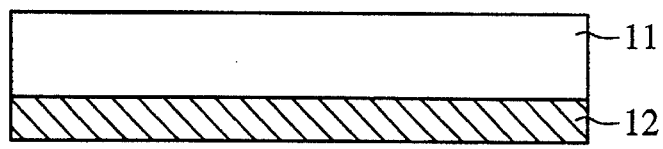
FIGS. 5A to 5N are sections illustrating a manufacturing process according to a Second embodiment of the present invention.
Figure 5B:
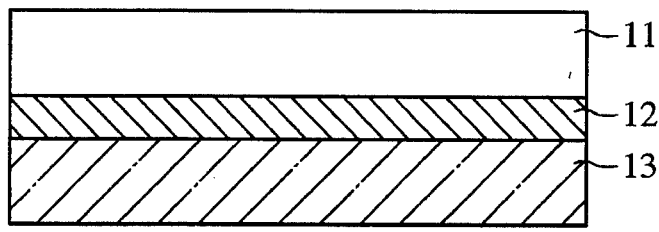
Figure 5C:
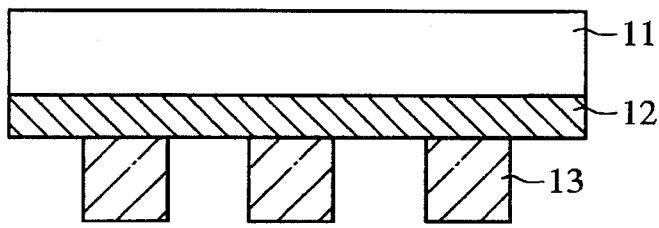
Figure 5D:
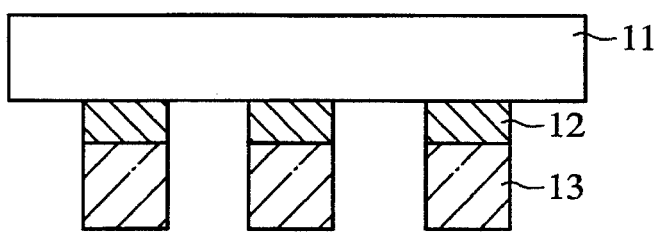
Figure 5E:
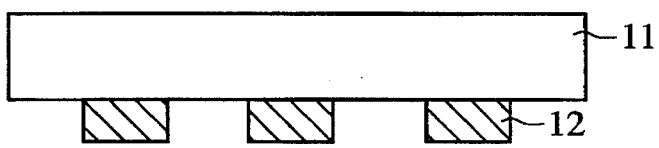
Figure 5F:
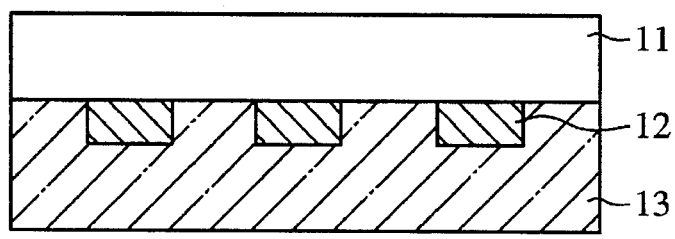

Light shading film 12 is formed on quartz glass substrate 11 (FIG. 5A). Photoresist 13 is applied to light shading film 12 (FIG. 5B). Photoresist 13 is developed into a plurality of patterns of photoresist 13 having an interval (which may be uniform) (FIG. 5C). Light shading film 12 is etched except in areas covered by developed photoresist 13 (FIG. 5D). The remaining portions of photoresist 13 are removed so that a plurality of light shading films 12 are arranged on quartz glass substrate 11 as illustrated (FIG. 5E). Photoresist 13' is applied on quartz glass substrate 11 and light shading films 12 (FIG. 5F).

Figure 5G:
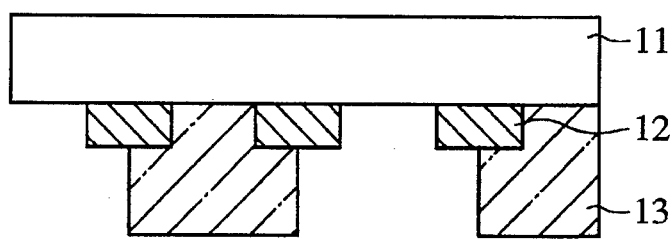
Figure 5H:
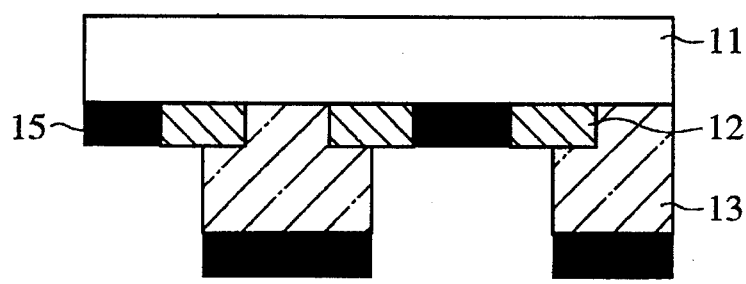
Figure 5I:
Figure 5J:
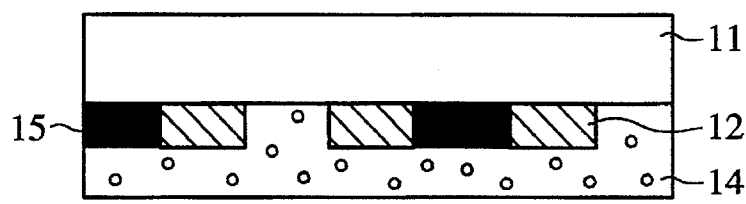
Figure 5K:
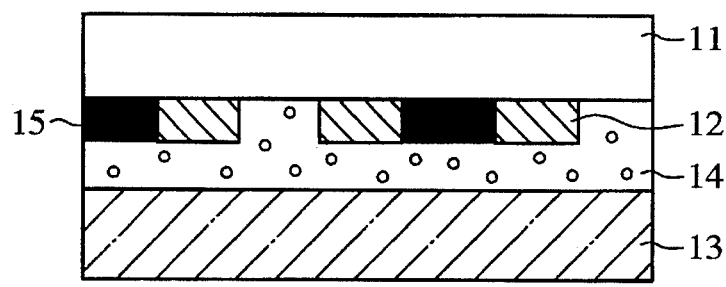
Figure 5L:
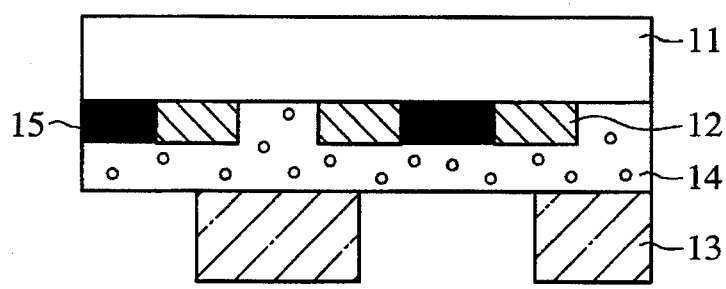
Figure 5M:
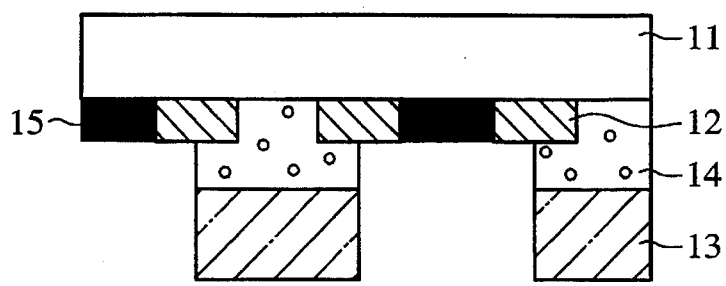
Figure 5N:
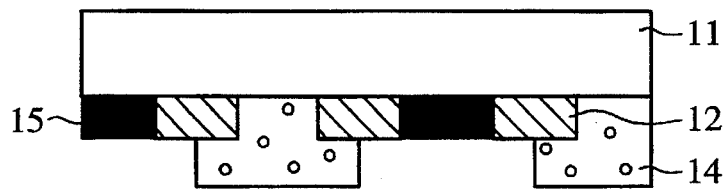

Photoresist 13' is developed and dried on pairs of light shading films 12 as illustrated (FIG. 5G). Semi-transparent light shading film 15 is applied on quartz glass substrate 11 and photoresist 13' (FIG. 5H). The remaining portions of photoresist 13' are removed, and a plurality of light shading films 12 and semi-transparent light shading films 15 remain as illustrated (FIG. 5I). Phase shift layer 14 is applied on the plurality of light shading films 12 and semi-transparent light shading films 15 (FIG. 5J). Photoresist 13" is applied on phase shift layer 14 (FIG. 5K). Photoresist 13" is developed so as to remain on pairs of light shading film 12 as illustrated, on which semi-transparent light shading film 15 is not applied (FIG. 5L). Phase shift layer 14 is etched using photoresist 13" as a mask (FIG. 5M). The remaining portions of photoresist 13" are removed (FIG. 5N). As a result, semi-transparent light shading film 15 is applied between pairs of light shading film 12 on which phase shift layer 14 is applied as illustrated, and a phase shift mask with more equal intensities and energies of transmitted light may be produced.

A second embodiment of the present invention is thus completed.

Although various preferred embodiments of the present invention have been disclosed for illustrative purposes, those skilled in the art will appreciate that various modifications, additions and/or substitutions are possible without departing from the scope and spirit of the present invention as disclosed in the claims.

What is claimed is:

1. A phase shift mask comprising:
   a substrate;
   a plurality of first light shading film pairs formed on the substrate, wherein each of the first light shading film pairs comprises two light shading film elements;
   a plurality of phase shift layers formed on the substrate between the two elements of each of the first light shading film pairs; and
   a plurality of second light shading films formed on the substrate between the first light shading film pairs.

2. The phase shift mask of claim 1, wherein the second light shading films have a thickness d, wherein d is obtained by the expression $d=\lambda/2n(n'+1)$, wherein $\lambda$, is the wavelength of light incident on the phase shift mask, n is the refractive index of the phase shift layers, and n' is the refractive index of the second light shading films.

3. The phase shift mask of claim 1, wherein the substrate comprises a light-transmitting insulating substrate.

4. The phase shift mask of claim 3, wherein the light-transmitting insulating substrate comprises quartz or quartz glass.

5. The phase shift mask of claim 1, wherein the second light shading films comprise chrome, chrome oxide or zinc.

6. The phase shift mask of claim 1, wherein the intensity of incident light transmitted through the phase shift layers is approximately equal to the intensity of incident light transmitted through the second light shading films.

7. A method of manufacturing a phase shift mask comprising the steps of:
   providing a substrate;
   forming a plurality of first light shading film pairs on the substrate, wherein each of the first light shading film pairs comprises two light shading elements;
   forming a plurality of phase shift layers on the substrate between the two elements of each of the plurality of first light shading film pairs; and
   forming a plurality of second light shading films on the substrate between the first light shading film pairs.

8. The method of claim 7, wherein the second light shading films have a thickness d, wherein d is obtained by the expression $d=\lambda/2n(n'+1)$, wherein $\lambda$ is the wavelength of light incident on the phase shift mask, n is the refractive index of the phase shift layers, and n' is the refractive index of the second light shading films.

9. The method of claim 7, wherein the second light shading films comprise chrome, chrome oxide or zinc.

10. The method of claim 7, wherein the intensity of incident light transmitted through the phase shift layers is approximately equal to the intensity of incident light transmitted through the second light shading films.

11. A method of manufacturing a phase shift mask comprising the steps of:
    providing a substrate;
    forming a plurality of first light shading film pairs on the substrate, wherein each of the first light shading film pairs comprises two light shading elements;
    forming a plurality of second light shading films on the substrate between the first light shading film pairs; and
    forming a plurality of phase shift layers on the substrate between the two elements of each of the first light shading film pairs.

12. The method of claim 11, wherein the intensity of incident light transmitted through the phase shift layers is approximately equal to the intensity of incident light transmitted through the second light shading films.

* * * * *

UNITED STATES PATENT AND TRADEMARK OFFICE
CERTIFICATE OF CORRECTION

PATENT NO. : 5,660,955
DATED      : August 26, 1997
INVENTOR(S): Oh-Seok Han

It is certified that error appears in the above-indentified patent and that said Letters Patent is hereby corrected as shown below:

On the title page, Item [73],

The Assignee "LG Semkon Co., Ltd." should be
--LG Semicon Co., Ltd.--

Signed and Sealed this

Thirtieth Day of December, 1997

Attest:

BRUCE LEHMAN

Attesting Officer

Commissioner of Patents and Trademarks